United States Patent
Jong et al.

(10) Patent No.: US 7,863,725 B2
(45) Date of Patent: Jan. 4, 2011

(54) POWER DEVICE PACKAGES AND METHODS OF FABRICATING THE SAME

(75) Inventors: Man-kyo Jong, Bucheon-si (KR); Joon-seo Son, Seoul (KR); Seung-won Lim, Bucheon-si (KR); O-soeb Jeon, Seoul (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 1 day.

(21) Appl. No.: 12/273,373

(22) Filed: Nov. 18, 2008

(65) Prior Publication Data

US 2009/0127685 A1    May 21, 2009

(30) Foreign Application Priority Data

Nov. 21, 2007   (KR) .................. 10-2007-0119309

(51) Int. Cl.
*H01L 23/52* (2006.01)
(52) U.S. Cl. ..................................... 257/691; 257/666
(58) Field of Classification Search ................ 257/686, 257/691, 723, 724, 777
See application file for complete search history.

(56) References Cited

U.S. PATENT DOCUMENTS

| | | | | |
|---|---|---|---|---|
| 5,057,906 A | * | 10/1991 | Ishigami | ..................... 257/706 |
| 7,291,869 B2 | * | 11/2007 | Otremba | ..................... 257/107 |
| 2005/0224945 A1 | * | 10/2005 | Saito et al. | .................. 257/686 |
| 2007/0040260 A1 | * | 2/2007 | Otremba | ..................... 257/686 |
| 2007/0132079 A1 | * | 6/2007 | Otremba et al. | ............. 257/685 |
| 2009/0218669 A1 | * | 9/2009 | Wang | .......................... 257/686 |
| 2010/0019391 A1 | * | 1/2010 | Strzalkowski | ............... 257/777 |
| 2010/0038768 A1 | * | 2/2010 | Kim et al. | .................... 257/686 |

* cited by examiner

*Primary Examiner*—S. V Clark
(74) *Attorney, Agent, or Firm*—Townsend and Townsend and Crew LLP

(57) ABSTRACT

Provided is a power device package including: a substrate including at least one first die attach region; at least one first power semiconductor chip and at least one second power semiconductor chip that are stacked in order on the first die attach region; at least one die attach paddle that is disposed between the at least one first power semiconductor chip and the at least one second power semiconductor chip, wherein the die attach paddle comprises an adhesive layer that is attached to a top surface of the first power semiconductor chip; a conductive pattern including a second die attach region, on which the second semiconductor chip is mounted, and a wire bonding region that is electrically connected to the second die attach region; and an interlayer member between the adhesive layer and the conductive pattern; and a plurality of firs leads electrically connected to at least one of the at least one first power semiconductor chip and the at least one second power semiconductor chip.

16 Claims, 8 Drawing Sheets

US 7,863,725 B2

POWER DEVICE PACKAGES AND METHODS OF FABRICATING THE SAME

CROSS-REFERENCES TO RELATED APPLICATIONS

This application claims the benefit of Korean Patent Application No. 10-2007-0119309, filed on Nov. 21, 2007 in the Korean Intellectual Property Office, the disclosure of which is incorporated herein in its entirety by reference.

BACKGROUND OF THE INVENTION

1. Field of the Invention

The present invention relates to power device packages and methods of manufacturing the same, and more particularly, to power device packages including a plurality of stacked power semiconductor chips, and methods of manufacturing such power device packages.

2. Description of the Related Art

Recent developments in power electronics including such power devices as servo drivers, inverters, silicon-controlled rectifiers (SCRs) and converters are leading to manufacturing light and small power devices with excellent performance characteristics. Related researches are being actively conducted into smart or intelligent power modules in which a variety of power semiconductor chips and low power semiconductor chips such as IC chips for controlling the power semiconductor chips, can be integrated into one package.

In the conventional art, a plurality of semiconductor chips are individually mounted in die attach regions of a substrate in order to manufacture a plurality of semiconductor chips into one package. However, since the footprint area of the conventional power device package is increased as the number of mounted semiconductor chips increases, a desired compact power device package cannot be obtained. In addition, as the volume of the conventional power device package is increased, its electrical and mechanical reliability may be readily deteriorated due to temperature cycles that are repeated in a range of high temperature, and the life span of the power device package may be shorted.

Therefore, a stacked power device package, in which stacked power semiconductor chips are mounted on a substrate, has recently been suggested to minimize the footprint area and volume of the power device package. However, the cost for manufacturing the stacked power device package is relatively high because the wiring process for electrical connection between the stacked power semiconductor chips is complicated and expensive. Also, since vertical type power semiconductor devices such as insulated-gate bipolar transistors (IGBTs), metal-oxide-semiconductor (MOS) transistors, power diodes, power regulators, etc. use a lower surface of semiconductor chips as a drain electrode or a ground electrode, it is difficult to stack the power device chips into a power device package.

BRIEF SUMMARY OF THE INVENTION

Aspects of the present invention provide power device packages in which a wiring process for electric connection between stacked power semiconductor chips can be simplified, wherein the stacked power device packages have excellent compatibility with power semiconductor chips whose lower surface is used as electrodes, and the electric and mechanical characteristics of the power device packages cannot be easily deteriorated due to heat during the operation thereof.

Aspects of the present invention also provide methods of manufacturing the power device packages having the above-described advantages at low cost.

According to an aspect of the present invention, an exemplary power device package comprises a substrate including at least one first die attach region, at least one first power semiconductor chip and at least one second power semiconductor chip stacked in order on the first die attach region, and at least one die attach paddle disposed between the at least one first power semiconductor chip and the at least one second power semiconductor chip. The die attach paddle comprises an adhesive layer that is attached to a top surface of the first power semiconductor chip, a conductive pattern, and an interlayer member between the adhesive layer and the conductive pattern. The conductive pattern includes a second die attach region, on which the second semiconductor chip is mounted, and a wire bonding region that is electrically connected to the second die attach region. The exemplary power device package further comprises a plurality of first leads electrically connected to at least one of the at least one first power semiconductor chip and the at least one second power semiconductor chip.

In some embodiments, the adhesive layer of the die attach paddle may include a resin-based epoxy, a paste, and/or an adhesive tape. The conductive pattern of the die attach paddle may include a copper layer.

The second die attach region and the wire bonding region of the paddle's conductive pattern may be electrically connected to each other. In some embodiments, the conductive pattern may comprise a gap to separate at least a portion of the second die attach region and at least a portion of the wire bonding area from each other. The lower surface of a second power semiconductor chip attached to the die attach region may function as an electrode.

In some embodiments, the wire bonding region of the die attach paddle may be electrically connected to one of the first leads or to the conductive pattern on the substrate via a first wire. The die attach paddle may be disposed so as to expose a connection pad of the first power semiconductor chip, and the connection pad of the first power semiconductor chip and a connection pad of the second power semiconductor chip may be electrically connected via a second wire. The connection pad of the second power semiconductor chip may be electrically connected to the first lead or to the conductive pattern on the substrate via a third wire. In some embodiments, the second wire and the third wire may be provided by one stitch bonded wire.

According to another aspect of the present invention, an exemplary method of manufacturing a power device package comprises obtaining a die attach paddle substrate including an interlayer member layer and a conductive pattern formed on the interlayer member layer; attaching an adhesive layer to a surface of the interlayer member layer opposite to the conductive pattern; forming a die attach paddle by singulating the die attach paddle substrate and the adhesive layer; attaching the adhesive layer of the die attach paddle to a top surface of the first power semiconductor chip mounted on the first die attach region on the substrate; and attaching a lower surface of the second power semiconductor chip to a second die attach region of the die attach paddle. The singulation process is known in the semiconductor art and is the process where one or more components, which are initially part of a larger entity such as a substrate or wafer, are separated from the larger entity and made into individual entities. As used herein, the action of "singulating" a component (e.g., the die attach paddle) means separating the component from the larger entity (e.g., the die attach paddle substrate and the adhesive layer), and the action of "singulating" a larger entity (e.g., the die attach paddle substrate and the adhesive layer) means separating one or more individual components (e.g., the die attach paddle) from the larger entity.

In some embodiments, the conductive pattern of the die attach paddle may comprise a plurality of patterns separated apart from one another. The forming of the die attach paddle may comprise cutting the interlayer member layer and the adhesive layer between the patterns. The adhesive layer may be provided together with a detachable base film for handling the die attach paddle, with the base film being detachably attached (e.g., lightly adhered) to the adhesive layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
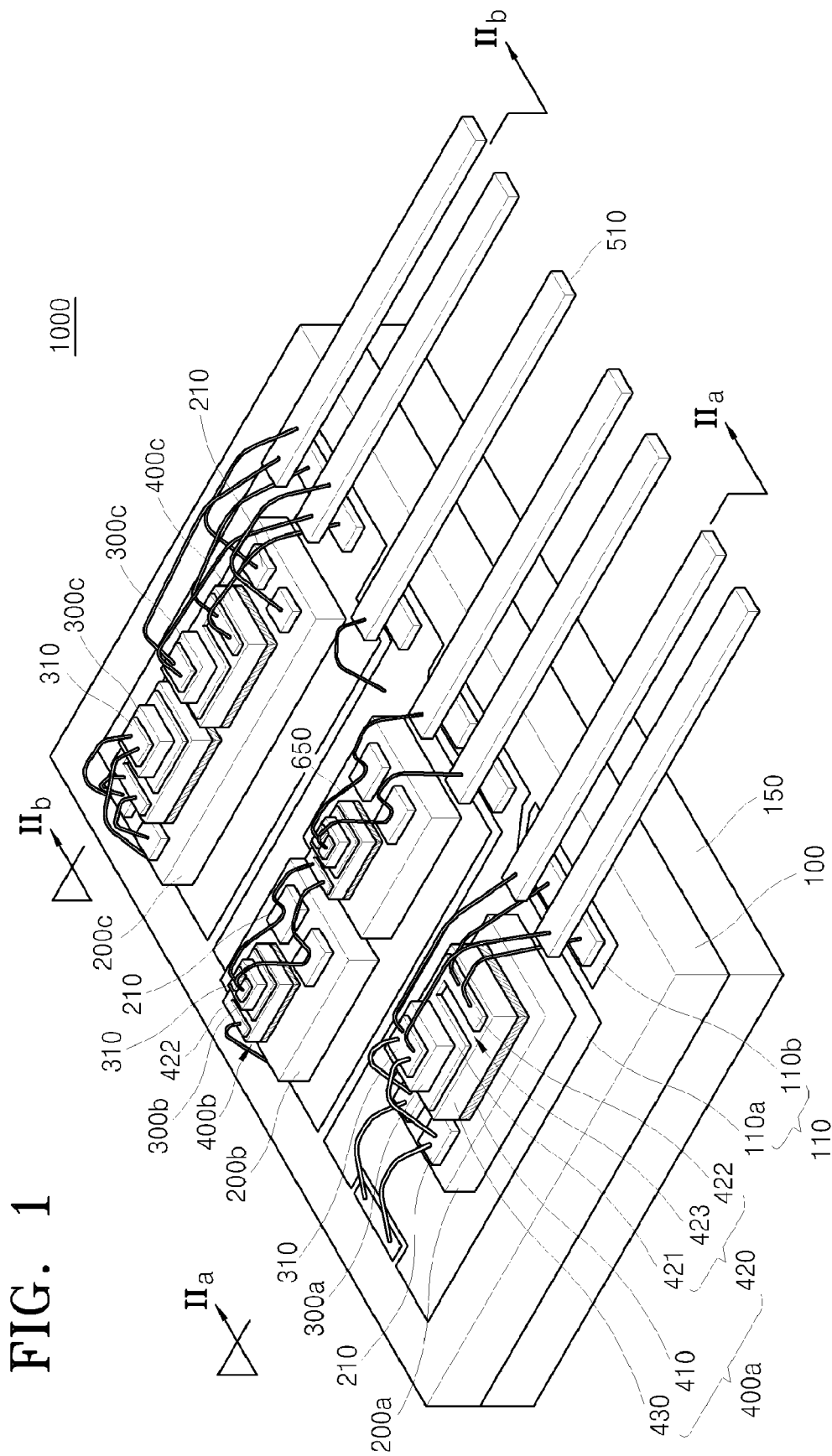
FIG. 1 is a perspective view of a power device package according to an embodiment of the present invention.

The present invention will now be described more fully with reference to the accompanying drawings, in which exemplary embodiments according to the invention are shown.

The invention may, however, be embodied in many different forms and should not be construed as being limited to the embodiments set forth herein; rather, these embodiments are provided so that this disclosure will be thorough and complete, and will fully convey the concept of the invention to those skilled in the art.

It will also be understood that when a layer is referred to as being "on" another layer or substrate, it can be directly on the other layer or substrate, or intervening layers may also be present. In the drawings, the thicknesses and sizes of layers and regions are exaggerated for clarity, and like reference numerals in the drawings denote like elements. It will also be understood that when an element, such as a layer, a region, or a substrate, is referred to as being "on," "connected to," "electrically connected to," "coupled to," or "electrically coupled to" another element, it may be directly on, connected or coupled to the other element, or one or more intervening elements may be present. In contrast, when an element is referred to as being "directly on," "directly connected to" or "directly coupled to" another element or layer, there are no intervening elements or layers present. The term "and/or" used herein includes any and all combinations of one or more of the associated listed items.

The terms used herein are for the purpose of illustrating the present invention only and should not be construed to limit the meaning or the scope of the present invention. As used in this specification, a singular form may, unless definitely indicating a particular case in terms of the context, include a plural form. Also, the expressions "comprise" and/or "comprising" used in this specification neither define the mentioned shapes, numbers, steps, operations, members, elements, and/or groups of these, nor exclude the presence or addition of one or more other different shapes, numbers, steps, operations, members, elements, and/or groups of these, or addition of these. Spatially relative terms, such as "over," "above," "upper," "under," "beneath," "below," "lower," and the like, may be used herein for ease of description to describe one element or feature's relationship to another element(s) or feature(s) as illustrated in the figures. It will be understood that the spatially relative terms are intended to encompass different orientations of the device (e.g., package) in use or operation in addition to the orientation depicted in the figures. For example, if the device in the figures is turned over, elements described as "below" or "beneath" or "under" other elements or features would then be oriented "over" or "above" the other elements or features. Thus, the exemplary term "above" may encompass both an above and below orientation.

As used herein, terms such as "first", "second", etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the scope of the present invention.

The present invention will now be described more fully with reference to the accompanying drawings, in which exemplary embodiments according to the invention are shown. In the drawings, modification of the illustrated shapes may be expected according to the manufacturing technique and/or tolerance in the drawings. Accordingly, the embodiments according to the present invention should not be construed as being limited to the particular forms in the illustrated drawings, and should include changes in the shape caused during the manufacturing process.

Figure 2A:
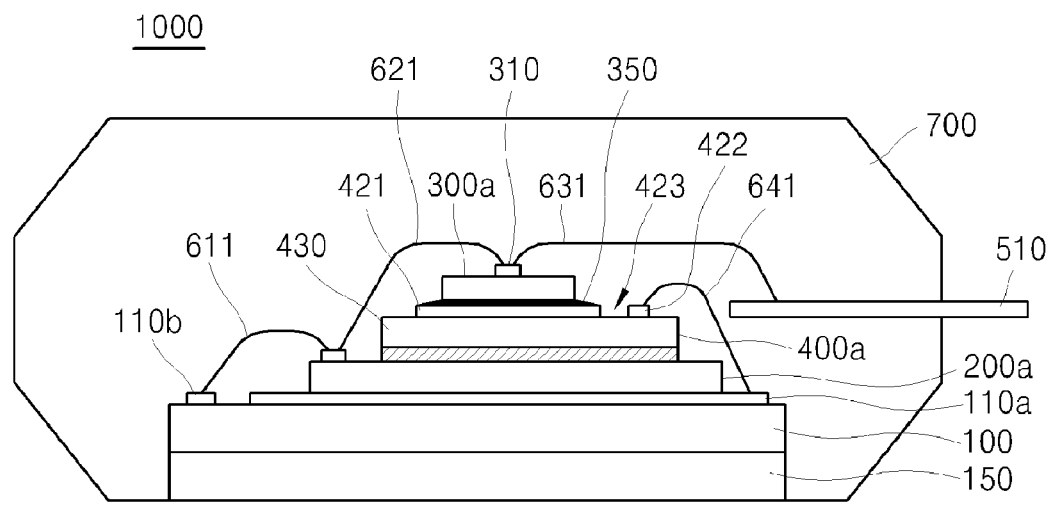
FIG. 2A is a cross-sectional view of the power device package of FIG. 1 cut along a line IIa-IIa.
Figure 2B:
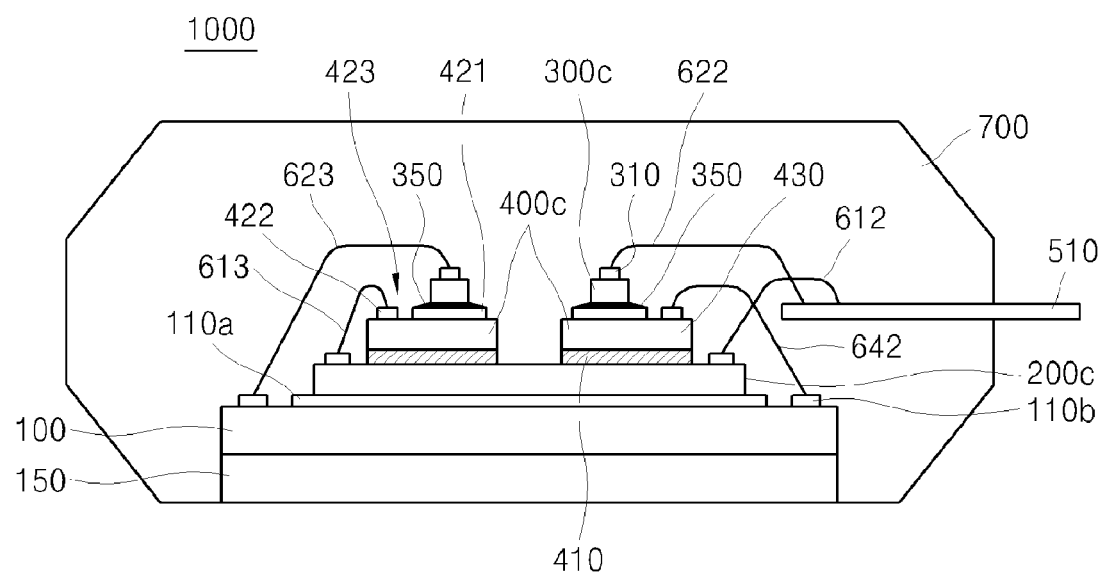
FIG. 2B is a cross-sectional view of the power device package of FIG. 1 cut along a line IIb-IIb.

FIG. 1 is a perspective view illustrating a power device package 1000 according to an embodiment of the present invention. FIG. 2A is a cross-sectional view of the power device package of FIG. 1 cut along a line IIa-IIa. FIG. 2B is a cross-sectional view of the power device package of FIG. 1 cut along a line IIb-IIb. In FIG. 1, a molding member 700 is omitted for convenience of explanation; however, the molding member 700 is completely disclosed in FIGS. 2A and 2B.

Referring to FIGS. 1, 2A, and 2B, the power device package 1000 may include first power semiconductor chips 200a, 200b, and 200c and second power semiconductor chips 300a, 300b, and 300c that are stacked on a first die attach region 110a of a substrate 100. The first and second power semiconductor chips 200a, 200b, 200c, 300a, 300b, and 300c may comprise metal-oxide-semiconductor field-effect transistors (MOSFETs), bipolar junction transistors (BJTs), insulated-gate bipolar transistors (IGBTs), diode devices, and/or other power-handling devices for controlling electrical power in such devices as servo drivers, inverters, power regulators, and converters, and so on. Connection pads 210 and 310 of the stacked first and second power semiconductor chips 200a, 200b, 200c, 300a, 300b, and 300c are electrically interconnected via first wires 611, 612, 613, second wires 621, 622, 623, third wires 631, and fourth wires 641, 642. These wires are described below in greater detail.

In some embodiments according to the present invention, the size of the second power semiconductor chips 300a, 300b, and 300c that are mounted on the first power semiconductor chips 200a, 200b, and 200c may be smaller than the size of the first power semiconductor chips 200a, 200b, and 200c. For example, the first power semiconductor chips 200a and 200c may comprise transistors such as MOSFETs, BJTs, and/or IGBTs, and the second power semiconductor chips 300a and 300c may comprise diodes that are smaller than the transistors. However, this is merely an example, and other configurations are also possible. For example, the first power semiconductor chip 200b may be a large-sized MOSFET having a large current capacity, and the second power semiconductor chip 300b may be a small-sized MOSFET having a small current capacity.

Regarding the stacking configuration of the first and second power semiconductor chips, one second power semiconductor chip 300a or 300b may be stacked on one first power semiconductor chip 200a or 200b by using one die attach paddle 400a or 400b. Alternatively, a plurality of second power semiconductor chips 300c, such as two such chips, may be stacked on a first power semiconductor chip 200c having a large current capacity, by using one or more die attach paddles 400c (the use of two die attach paddles 400c is shown in FIG. 2B).

The stacking configuration of the first power semiconductor chips 200a, 200b, 200c and the second power semiconductor chips 300a, 300b, 300c may include various combinations of the stacking configuration disclosed by FIG. 1. Although not illustrated in FIG. 1, it is well understood that a power device package in which another die attach paddle is attached to the second power semiconductor chips 300a, 300b, and 300c and third power semiconductor chips are stacked on the die attach paddle, may also be included in the embodiments according to the present invention. Also, a power device package in which one die attach paddle is attached to a plurality of first power semiconductor chips and one or more second power semiconductor chips are stacked on the die attach paddle, may be included in the embodiments according to the present invention.

Hereinafter, the substrate 100 and the die attach paddle 400a, 400b, and 400c will be described in detail. The substrate 100 may comprise an insulating substrate on which a conductive pattern 110 is formed. Conductive pattern 110 may comprise appropriate regions 110a and 110b, some of which (e.g., regions 110b) may be electrically conductive and some of which (e.g., regions 110a) may not be electrically conductive. The insulating substrate may comprise, for example, a printed circuit board (PCB), a flexible PCB (FPCB), an insulated metal substrate (IMS), a pre-molded substrate, or a direct bonded copper (DBC) substrate. However, these are just examples of the substrate, and the substrate of the present invention is not limited thereto. For example, the substrate 100 may comprise a conductive substrate provided by a lead frame.

The conductive pattern 110 of the substrate 100 may provide a first die attach region 110a, on which the first power semiconductor chips 200a, 200b, and 200c are mounted, and a interconnection region 110b that is electrically bonded to a wire and/or lead. When the first die attach region 110a is electrically conductive, a bottom surface of the first power semiconductor chips 200a, 200b, and 200c may be bonded to the first die attach region 110a by using an electrically conductive adhesive layer, for example, solder or a metal epoxy, to provide an electrical connection between die attach region 110a and the chip 200. If an electrical connection is not needed, then any adhesive layer may be used. In the embodiments, the first die attach region 110a is not limited to being electrically conductive. When first die attach region 110a is not electrically conductive, a chip 200 may be attached to it using any type of adhesive.

In some embodiments, a metal layer 150 may be disposed on a lower surface of the substrate 100 in order to increase the heat dissipation efficiency of the power device package 1000. The metal layer 150 may be exposed to the outside of the molding member 700 and coupled to an external heat sink (not shown).

Die attach paddles 400a, 400b, and 400c are attached to the first power semiconductor chips 200a, 200b, and 200c to stack the second power semiconductor chips 300a, 300b, and 300c. The die attach paddles 400a, 400b, and 400c include an adhesive layer 410, a conductive pattern 420, and an interlayer member 430 between the adhesive layer 410 and the conductive pattern 420. The adhesive layers 410 are attached to a top surface of the first power semiconductor chips 200a, 200b, and 200c. The adhesive layers 410 may comprise, for example, a resin-based epoxy, a paste, and/or an adhesive tape having excellent thermal resistance, and the adhesive layer 410 may be non-conductive. In some embodiments according to the present invention, the adhesive tape may comprise a high temperature tape that comprises a well-known glass tape, silicone tape, teflon tape, stainless foil tape, ceramic tape, and so forth. The thickness of the adhesive layer 410 may be, for example, 5-300 μm (microns).

The conductive pattern 420 of each die attach paddle 400a-400c includes a second die attach region 421 on which a lower surface of a second power semiconductor chip 300a-300c may be mounted, and a wire bonding region 422 that is electrically connected to the second die attach region 421. The conductive pattern 420 may include an aluminum layer, a copper layer, and/or an alloy layer thereof. When the conductive pattern 420 includes a copper layer, a well-known oxidation prevention layer, for example, a nickel layer or a gold layer, may be plated over the copper layer to prevent oxidation.

As illustrated in FIG. 1, the second die attach region 421 and the wire bonding region 422 may be electrically connected to each other by one conductive pattern 420. If necessary, the second die attach region 421 and the wire bonding region 422 may be realized as separate conductive patterns, and they may be electrically connected to each other by using a conductive connection member, such as a wire.

The lower surface of the second power semiconductor chips 300a, 300b, and 300c may be attached to the second die attach regions 421 of the die attach paddle 400a, 400b, and 400c. The lower surface of the second power semiconductor chips 300a, 300b, and 300c and the second die attach regions 421 may be attached using respective conductive adhesive members 350, which may comprise solder, a metal epoxy, a conductive paste, conductive tape, and so forth.

When coating a conductive adhesive member 350 on the second die attach region 421 or when pressing the second power semiconductor chips 300a, 300b, and 300c onto the second die attach regions 421 (such as before attaching the chips 300 with a reflow operation), the conductive adhesive member 350 may leak out around the second power semiconductor chip 300a, 300b, and 300c. The leaked adhesive member 350 may intrude into the adjacent bonding region 422, and this may impede a wire bonding process which is to be described later.

In order to prevent the leakage of the adhesive member 350, in some embodiments according to the present invention, a gap 423 may be formed in the conductive pattern 420, and the gap 423 separates the second die attach region 421 and a portion or the whole of the wire bonding region 422. In this case, a surface of the interlayer member 430 may be exposed by the gap 423. Even if the adhesive member 350 is leaked around the second power semiconductor chips 300a, 300b, and 300c, the leaked adhesive member 350 is prevented from extending to the wire bonding region 422 by the gap 423. The shape of the gap 423 may vary. For example, the gap 423 may be formed to define an opening in the form of a slit (not shown), which has a predetermined width and length, instead of having one opened end as illustrated in FIG. 1.

Alternatively, in order to prevent extension of the adhesive member 350, a leakage preventing structure such as a dam may be provided around the second die attach region 421. Alternatively, the second die attach region 421 and the wire bonding region 422 may each be formed of different materials, or the wire bonding region 422 may be formed to have a greater thickness than the second die attach region 421, thereby providing a step barrier.

In the die attach paddles 400a, 400b, and 400c according to the current embodiment, an interlayer member 430 that separates the adhesive layer 410 and a conductive pattern 420 may be electrically insulating. For example, the interlayer member 430 may comprise a ceramic, a polymer, and/or an insulated metal substrate. That is, the interlayer member 430 may provide, together with the conductive pattern 420 thereon, a substrate on which the second power semiconductor chips are mounted and that can be wire-bonded, such as a PCB, a flexible PCB, an insulated metal substrate (IMS), a pre-molded substrate or a direct bonded copper (DBC) substrate. These are just examples of the substrate, and the present invention is not limited to these substrates.

In some embodiments according to the present invention, the size of the die attach paddles 400a, 400b, and 400c may be smaller than the size of the underlying first power semiconductor chips as illustrated in FIGS. 1, 2A, and 2B. For example, the die attach paddles 400a, 400b, and 400c may have a size that is sufficient to expose the connection pads 210 of the first power semiconductor chips 200a, 200b, and 200c for wire bonding, and that is sufficient to provide the second die attach regions 421 and the wire bonding regions 422 for the second power semiconductor chips 300a, 300b, and 300c thereon.

The stacked first power semiconductor chips 200a, 200b, and 200c and the second power semiconductor chips 300a, 300b, and 300c may be electrically connected to a plurality of first leads 510, the connection pads 210, and the wiring regions 110b on the substrate 100 for the first and second power semiconductor chips 200a, 200b, 200c; 300a, 300b, and 300c, via first wires 611, 612, 613, second wires 621, 622, 623, third wires 631, and fourth wires 641, 642, as described below in greater detail. Hereinafter, as shown in FIGS. 2A and 2B, wires 611, 612, 613, 621, 622, 623, 631, 641, and 642, will be described, with respect to a case where the first power semiconductor chips 200a and 200c comprise bipolar transistors and the second power semiconductor chips 300a and 300c comprise diodes. However, the connecting configuration of the bipolar transistors, the diodes, and the wires is an example, and the embodiments according to the present invention are not limited thereto. The wires 611, 612, 613, 621, 622, 623, 631, 641, and 642 may be well-known power supply wires such as aluminum wires, and may have diameters of 5-20 mils to sustain high levels of current. The bonding process of the wires may be performed using a ball bonding process, a wedge bonding process, a stitch bonding process, and/or other known bonding processes.

The connection pad 210, such as a source and/or emitter connection pad that is provided on the first power semiconductor chip 200a, may be electrically connected to a interconnection region 110b of the substrate 100 by using a first wire 611 and/or to a connection pad 310 of the second power semiconductor chip 300a by using a second wire 621, as illustrated in FIG. 2A. In other embodiments, the connection pad 210 of the first power semiconductor chip 200c may be electrically connected to one of first leads 510 or the wire bonding region 422 of the die attach paddle 400c by first wires 612 and 613, as illustrated in FIG. 2B.

The anode connection pad 310 that is provided on the second power semiconductor chip 300a may be electrically connected to the connection pad 210 of the first power semiconductor chip 200a by using the second wire 621, as illustrated in FIG. 2A, and to the first lead 510 by using a third wire 631. In some embodiments, at least two of the first, second, and third wires 611, 621, 631 may be realized as one continuous wire. For example, the electric connection may be performed by using one wire and a stitch bonding method such as a wire 650 illustrated in FIG. 1. Also, the connection pad 310 of the second power semiconductor chip 300c may be electrically connected to the lead 510 or the wiring region 110b of the substrate 100 by using second wires 622 and 623, as illustrated in FIG. 2B.

The wire bonding region 422 of the die attach paddle 400a may be electrically connected to the first die attach region 110a on the substrate 100 by using a fourth wire 641, as illustrated in FIG. 2A, so that the lower surface of the first power semiconductor chip 200a, for example a drain electrode of a transistor, and the lower surface of the second power semiconductor chip 300a, for example a cathode of a diode, may have the same potential. Another fourth wire 642 may be connected to either of the interconnection regions 110b of the substrate 100 and one (not shown) of the first leads 510, as may be needed by the circuit.

Figure 3:
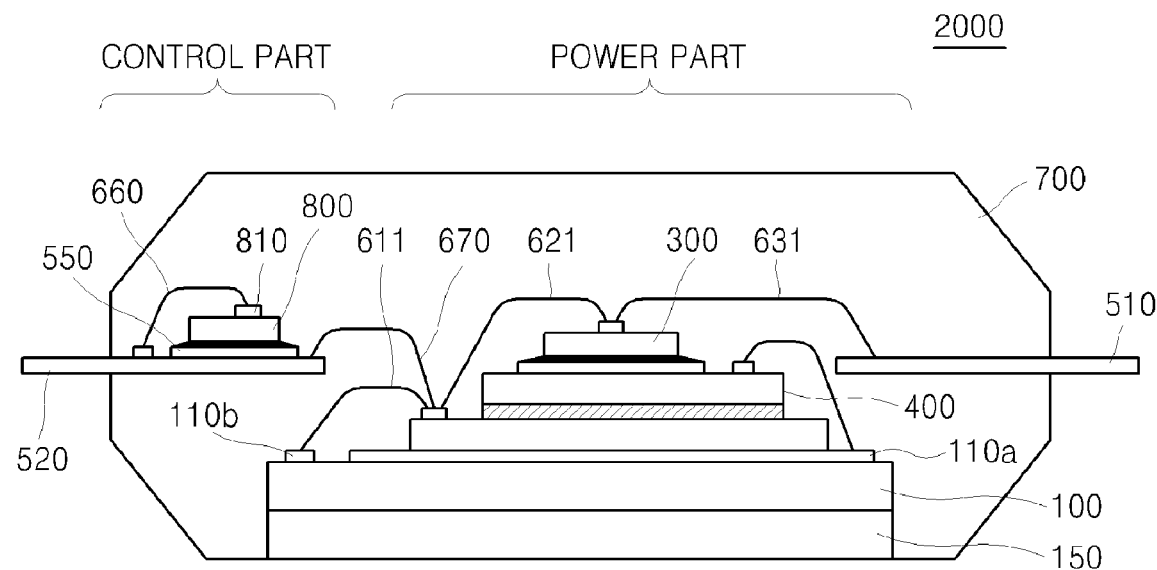
FIG. 3 is a cross-sectional view illustrating a power device package according to another embodiment of the present invention.

FIG. 3 is a cross-sectional view illustrating a power device package 2000 according to another embodiment of the present invention. Among the elements of FIG. 3, the elements having the same reference numerals as the elements in FIGS. 1, 2A, and 2B may be described similarly to the description provided with reference to FIGS. 1, 2A, and 2B.

Referring to FIG. 3, the power device package 2000 may further include a control chip 800 for controlling at least one of the first and second power semiconductor chips and a plurality of second leads 520 that are electrically connected to the control chip 800. The control chip 800 may comprise, for example, a micro-processor. Depending on the number of the first and second power semiconductor chips 200 and 300, two or more control chips may be provided. By implementing the control chip 800, a smart power device including a control unit and a power unit may be provided.

In some embodiments, the control chip 800 may be disposed on a die attach paddle 550 on a lead frame that may be opposite to the first lead 510 as shown in FIG. 3. Alternatively, although not illustrated in the FIG. 3, the control chip 800 may be disposed on the substrate 100. The control chip 800 may be electrically connected to one of second leads 520 via a fifth wire 660. Also, the second lead 520 that is connected to the control chip 800 may be electrically connected to the connection pad 210 of the first power semiconductor chip 200 via a sixth wire 670. It can be well understood from previously-described embodiments according to the present invention that the second lead 520 may be electrically connected to the interconnection region 110b on the substrate 100 or to the first lead 510 according to another embodiment. The fifth wire 660 and/or sixth wire 670 may comprise aluminum wire or gold wire, and may have a relatively small thickness of 0.8 through 3 mil. For the sixth wire 670, the above-described power supply wire may be applied.

According to the above embodiments of the present invention, as a plurality of power semiconductor chips are stacked using die attach paddles, the footprint area of the substrate may be reduced to a size for mounting first power semiconductor chips. Even if the substrate is an expensive DBC substrate, economical power device packages can be provided, since the area of the substrate is reduced. In addition, the die attach paddle according to the embodiments of the present invention includes a wire bonding region and thus the lower surface of the power semiconductor chip mounted on the die attach paddle can be used as an electrode, and thus a difficulty in view of a wiring process can be solved.

FIGS. 4A through 4D are plane views illustrating a method of manufacturing a die attach paddle in the process flow; and FIGS. 5A through 5D are cross-sectional views of the die attach paddle cut along corresponding cutting lines, Va-Va and Vb-Vb, of FIGS. 4A through 4D.

Figure 4A:
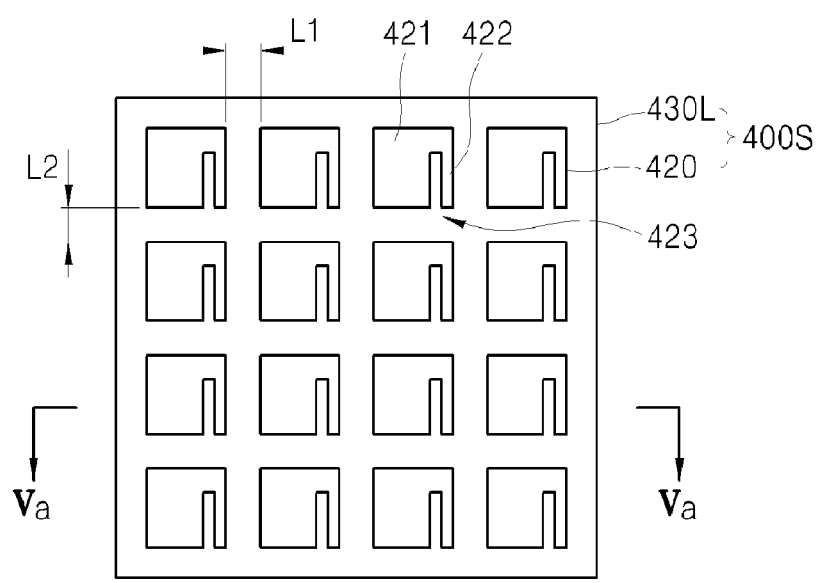
FIGS. 4A through 4D are plane views illustrating a method of manufacturing a die attach paddle in process flows according to an embodiment of the present invention.
Figure 5A:
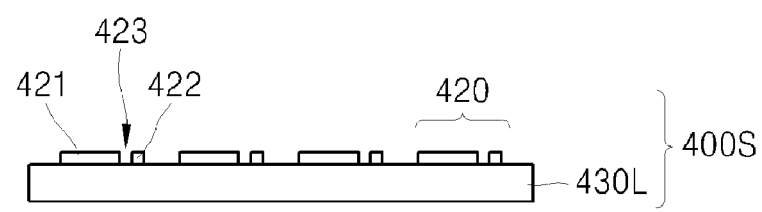
FIGS. 5A through 5D are cross-sectional views of the die attach paddle cut along corresponding cutting lines, Va-Va and Vb-Vb, of FIGS. 4A through 4D.

Referring to FIGS. 4A and 5A, a die attach paddle substrate 400S that includes an interlayer member layer 430L and a conductive pattern 420 on the interlayer member layer 430L may be obtained. Die attach paddle substrate 400S may be obtained by manufacturing it according to known manufacturing processes, or by receiving it from a vendor that has manufactured it according to aspects of the present invention using known manufacturing processes. In some embodiments, the conductive pattern 420 may include a plurality of patterns that are already patterned and separated apart from each other, such as at predetermined distances L1 and L2. Each of the patterns may include a die attach region 421 and a wire bonding region 422.

Figure 4B:
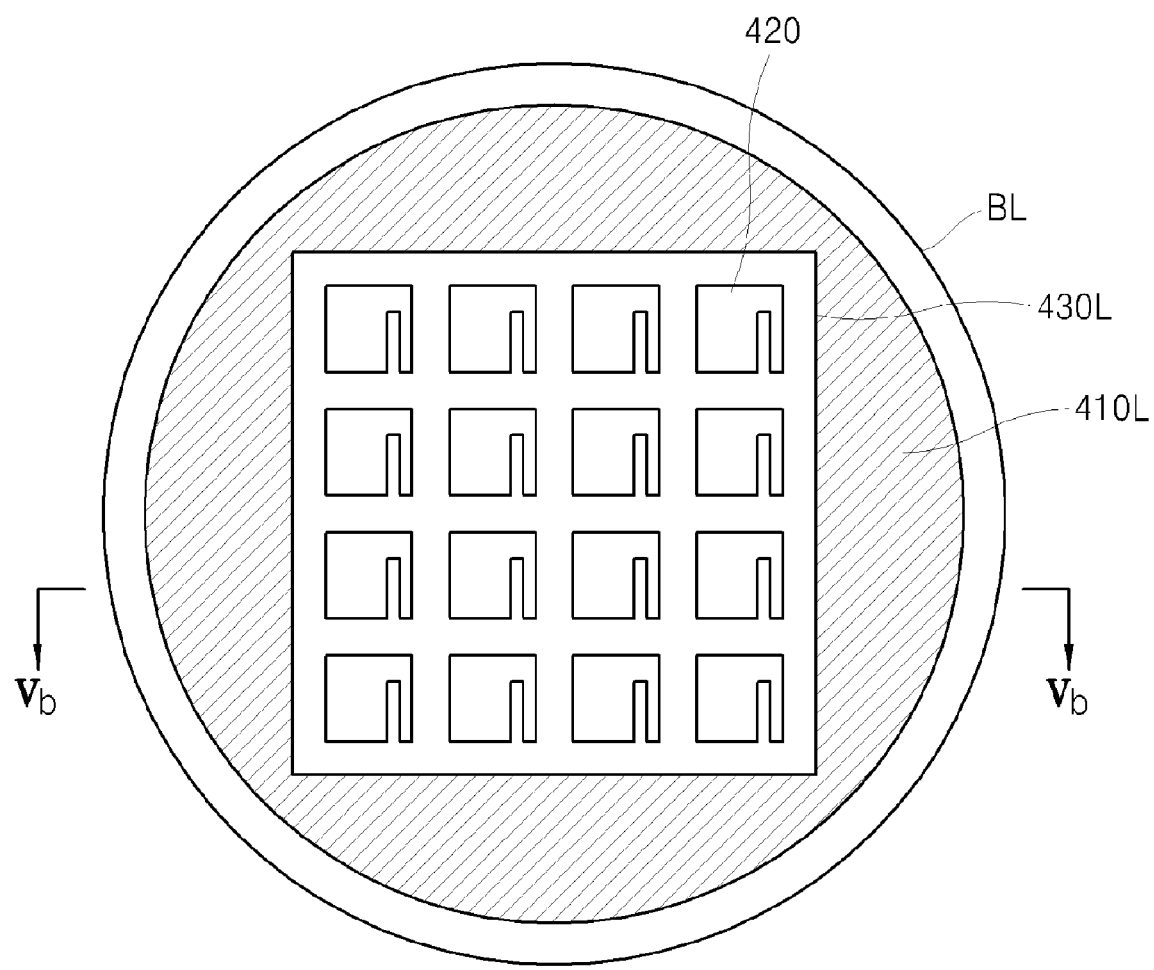
Figure 5B:
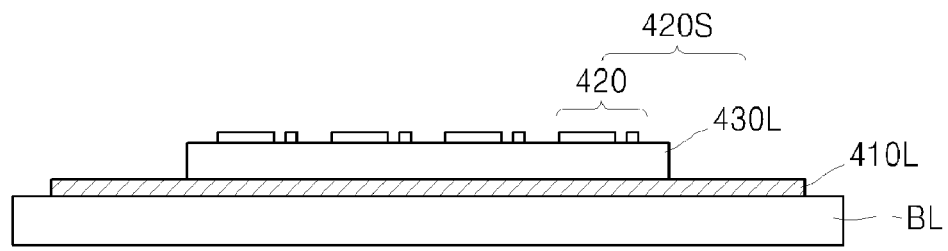

Referring to FIGS. 4B and 5B, an adhesive layer 410L is attached to a surface of the interlayer member layer 430L that is opposite to the conductive pattern 420 by coating, heating, and/or pressing the adhesive layer 410L. In some embodiments, the adhesive layer 410L may be provided with a detachable base film (BL) as a means for handling the die attach paddle; the base film (BL) is detachably attached (e.g., lightly adhered) to the adhesive layer 410L. The base film (BL) may comprise, for example, a dicing tape that is commonly used in a chip singulation process. Also, a handler (not shown) may be attached around the dicing tape in order to facilitate a handling operation.

Figure 4C:
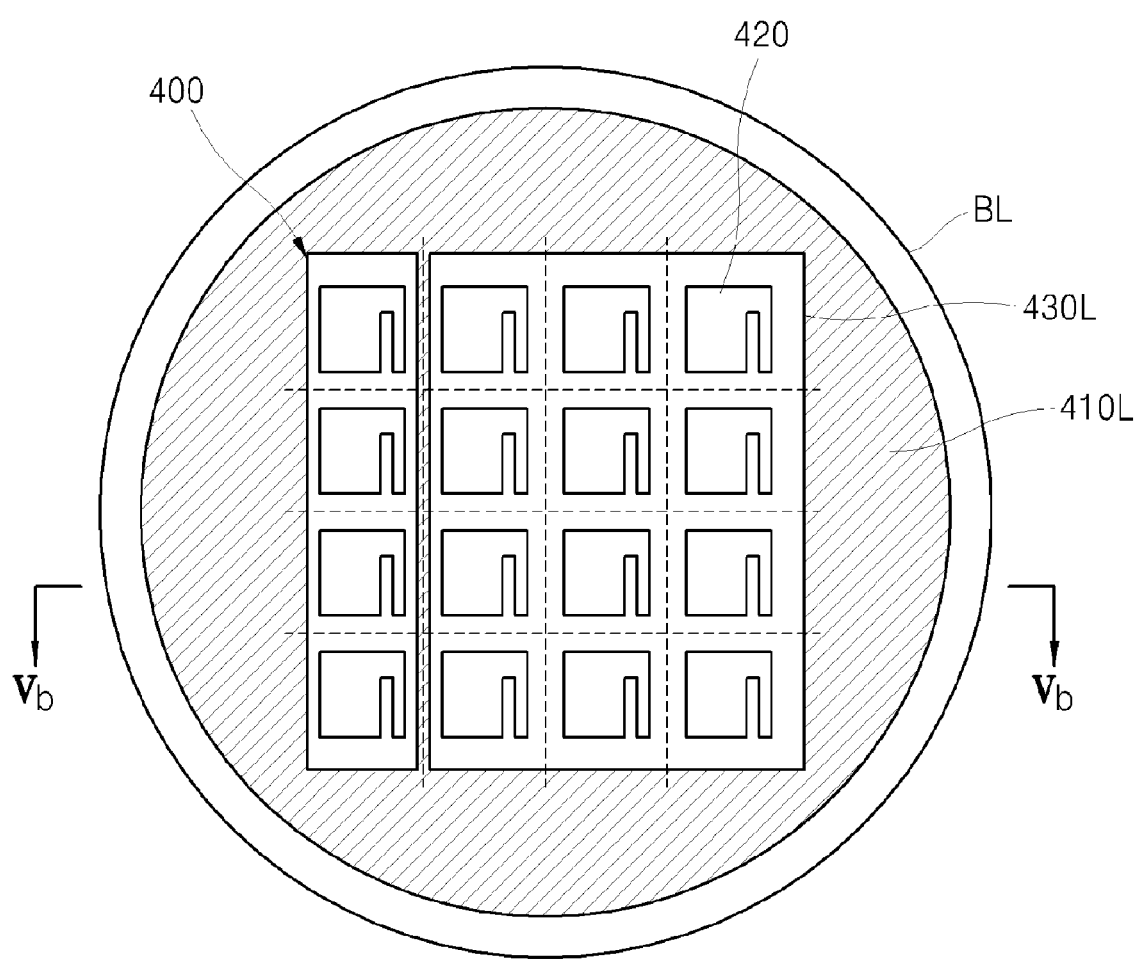
Figure 5C:
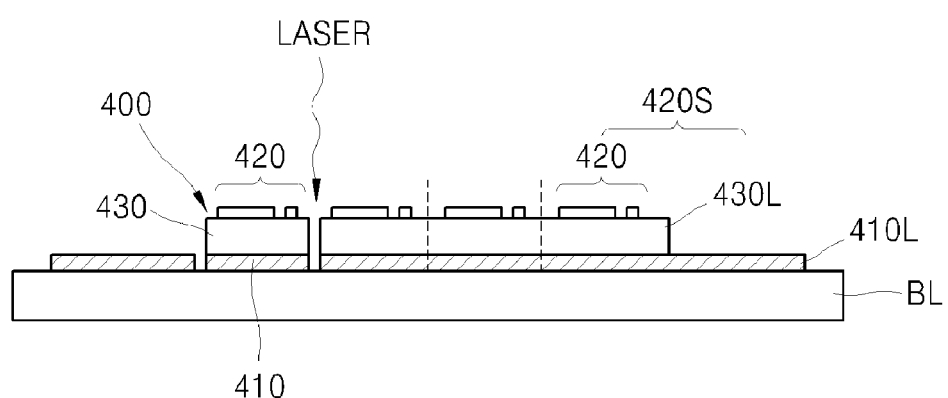

Referring to FIGS. 4C and 5C, by using a laser, a blade, or a saw that is widely used in semiconductor manufacturing processes, the die attach paddle substrate 400S and the adhesive layer 410L are singulated to form one or more instances of a die attach paddle 400. The singulation process is known in the semiconductor art and is the process where one or more components, which are initially part of a larger entity such as a substrate or wafer, are separated from the larger entity and made into individual entities. As used herein, the action of "singulating" a component means separating the component from the larger entity, and the action of "singulating" a larger entity means separating one or more individual components from the larger entity. When the conductive pattern 420 is formed of a plurality of separated patterns, such as described above, the singulation process can be performed by continuously cutting the interlayer member layer 430L and the adhesive layer 410L between the conductive patterns 420.

Figure 4D:
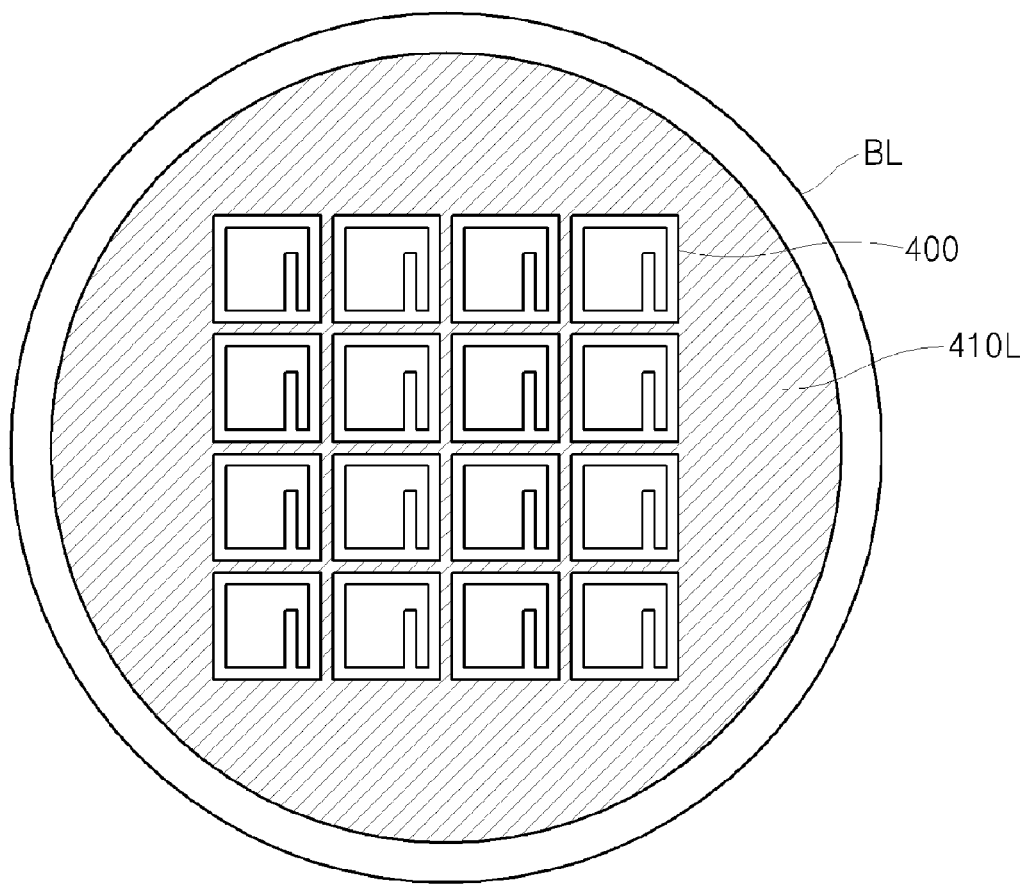
Figure 5D:
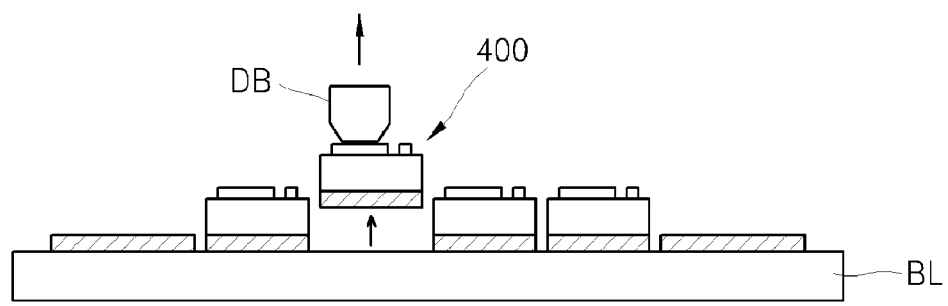

Referring to FIGS. 4D and 5D, the singulated die attach paddle 400 is separated from the base film (BL) using a pick-up method using a vacuum absorption method, for example. In order to separate the die attach paddle 400, a die bonder (DB) which is used in semiconductor packaging may be used.

Figure 6:
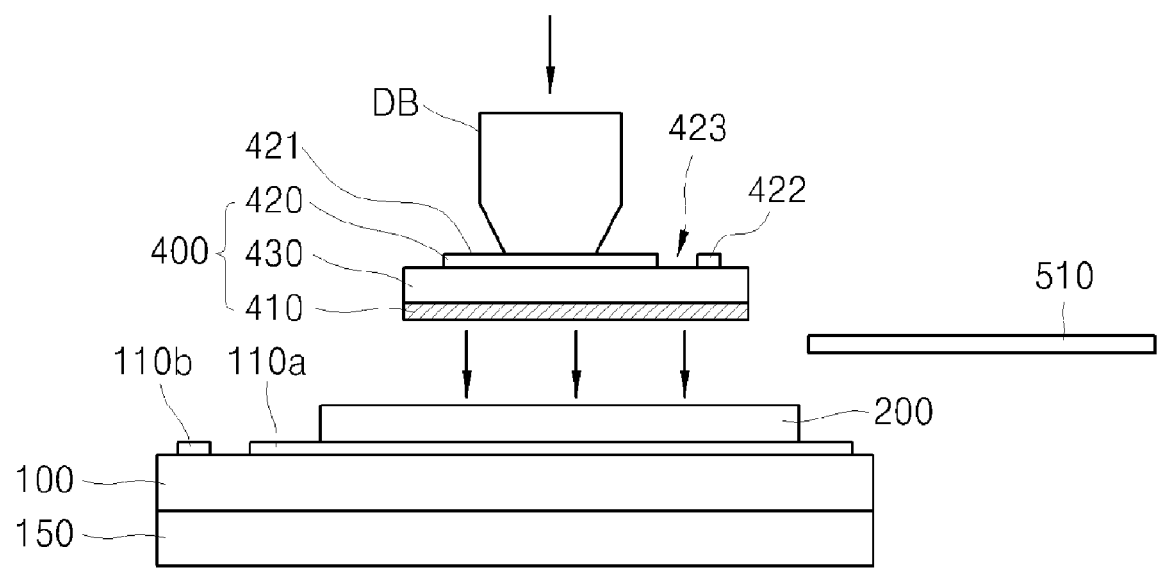
FIG. 6 is a cross-sectional view illustrating a method of attaching the die attach paddle according to an embodiment of the present invention onto a first power semiconductor chip.

FIG. 6 is a cross-sectional view illustrating a method of attaching the die attach paddle 400 onto a first power semiconductor chip 200. Referring to FIG. 6, the adhesive layer 410 of the die attach paddle 400 is attached to a top surface of the first power semiconductor chip 200 that is mounted on the substrate 100. In order to attach the adhesive layer 410, heat and/or pressure may be applied to the adhesive layer 410 through the die bonder DB. Then, the lower surface of the second power semiconductor chip is attached to the second die attach region 421 of the die attach paddle 400. In order to attach the lower surface of the second power semiconductor chip to the second die attach region 421, a solder, a metal epoxy, or a conductive paste may be coated on the second die attach region 421, or a conductive tape may be attached on the lower surface of the second power semiconductor chip.

Also, as described above with reference to FIG. 3, in order to provide a smart power module, a control chip may be further mounted on a paddle of a lead frame. Then, a wire bonding process that is appropriate for electrically connecting the first and second semiconductor chips is performed. When the wire bonding process is completed, the substrate is transferred to a molding apparatus, and a transfer molding process is performed, in which a molding member 700 for protecting components inside the power semiconductor package is formed. Then, as is well-known in the art, a subsequent process, such as a trimming process for separating leads from one another and forming process, is performed.

According to embodiments of the present invention, a compact power device package can be provided by reducing the footprint area of a substrate by stacking a plurality of power semiconductor chips by using die attach paddles. Also, in cases where the lower surface of the power semiconductor chip mounted on the die attach paddle can function as a drain electrode, electrical connection between the wire bonding region and the drain electrode is enabled by the bonding region of the die attach paddle, and thus difficulties in the wiring process can be solved. In addition, according to embodiments of the present invention, the total volume of the power device package is reduced and thus deformation due to a heat expansion of the package components, such as the substrate and the molding member, can be reduced, and thus a problem, such as reduction in the life span of the power device package due to repeated high temperature cycles, can be solved.

Also, since the power device package according to embodiments of the present invention is manufactured by stacking the power semiconductor chips by using a singulation process and a pick-up process using a laser or a saw which are widely used in semiconductor device manufacturing processes, the power device package according to embodiments of the present invention can be manufactured at low cost.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A power device package comprising:
a substrate including at least one first die attach region;

at least one first power semiconductor chip and at least one second power semiconductor chip stacked in order on the first die attach region;

at least one die attach paddle disposed between the at least one first power semiconductor chip and the at least one second power semiconductor chip; and a plurality of first leads electrically connected to at least one of the at least one first power semiconductor chip and the at least one second power semiconductor chip; and wherein the die attach paddle comprises an adhesive layer attached to a top surface of the first power semiconductor chip, an interlayer member disposed on the adhesive layer, and a conductive pattern disposed on the interlayer member, wherein the conductive pattern comprises a second die attach region and a wire bonding region, wherein the second power semiconductor chip is mounted on and electrically connected to the second die attach region, and wherein the wire bonding region is electrically connected to the second die attach region.

2. The power device package of claim 1, wherein the adhesive layer of the die attach paddle includes a resin-based epoxy, a paste, an adhesive tape, or any combination thereof.

3. The power device package of claim 1, wherein the conductive pattern of the die attach paddle includes a copper layer.

4. The power device package of claim 1, wherein the conductive pattern comprises a gap to separate at least a portion of the second die attach region and at least a portion of the wire bonding area from each other.

5. The power device package of claim 1, wherein the second power semiconductor chip and the second die attach region are attached using a conductive adhesive member.

6. The power device package of claim 1, wherein the interlayer member comprises an insulating substrate.

7. The power device package of claim 6, wherein the insulating substrate comprises a ceramic, a polymer, an insulated metal substrate, or any combination thereof.

8. The power device package of claim 1, wherein a lower surface of the second power semiconductor chip functions as an electrode.

9. The power device package of claim 1, further comprising:

a control chip for controlling at least one of the first and second power semiconductor chips; and a plurality of second leads electrically connected to the control chip.

10. The power device package of claim 9, wherein the control chip is mounted on a paddle of a lead frame that is separated from the substrate.

11. The power device package of claim 1, wherein the substrate includes an insulating substrate or a lead frame.

12. The power device package of claim 1, wherein the first power semiconductor chip comprises a transistor, and the second power semiconductor chip comprises a diode.

13. The power device package of claim 1, wherein the wire bonding region of the die attach paddle is electrically connected to one of the first leads or to the conductive pattern on the substrate via a first wire.

14. The power device package of claim 1, wherein the die attach paddle is disposed so as to expose a connection pad of the first power semiconductor chip, and the connection pad of the first power semiconductor chip and a connection pad of the second power semiconductor chip are electrically connected via a second wire.

15. The power device package of claim 14, wherein the connection pad of the second power semiconductor chip is electrically connected to the first lead or to the conductive pattern on the substrate via a third wire.

16. The power device package of claim 15, wherein the second wire and the third wire are provided by one stitch bonded wire.

* * * * *